(12) United States Patent
Komatani et al.

(10) Patent No.: US 8,921,950 B2
(45) Date of Patent: Dec. 30, 2014

(54) SEMICONDUCTOR DEVICE (71) Applicant: Sumitomo Electric Device Innovations, Inc., Yokohama (JP)

(72) Inventors: Tsutomu Komatani, Yokohama (JP); Shunsuke Kurachi, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 13/857,510

(22) Filed: Apr. 5, 2013

(65) Prior Publication Data
US 2013/0264657 A1 Oct. 10, 2013

(30) Foreign Application Priority Data
Apr. 6, 2012 (JP) ................. 2012-087764

(51) Int. Cl.
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 29/78 | (2006.01) |
| H01L 29/786 | (2006.01) |
| H01L 29/423 | (2006.01) |
| H01L 29/66 | (2006.01) |
| H01L 29/778 | (2006.01) |
| H01L 29/20 | (2006.01) |

(52) U.S. Cl.
CPC ...... H01L 29/7848 (2013.01); H01L 29/78681 (2013.01); H01L 29/42316 (2013.01); H01L 29/66462 (2013.01); H01L 29/7787 (2013.01); H01L 29/2003 (2013.01)
USPC ............... 257/402; 257/192; 438/289

(58) Field of Classification Search
USPC ............ 257/192, 402, E21.409; 438/289
See application file for complete search history.

(56) References Cited

U.S. PATENT DOCUMENTS

| 5,041,888 A * | 8/1991 | Possin et al. ................ 257/59 |
| 2008/0017862 A1* | 1/2008 | Lee et al. .................. 257/59 |
| 2008/0128823 A1* | 6/2008 | Takeoka ................... 257/369 |
| 2010/0155779 A1* | 6/2010 | Murase et al. ............. 257/192 |
| 2011/0198606 A1* | 8/2011 | Oda et al. ................. 257/72 |
| 2012/0032188 A1* | 2/2012 | Kanamura et al. .......... 257/76 |
| 2012/0119261 A1* | 5/2012 | Umeda et al. ............. 257/194 |
| 2012/0199913 A1* | 8/2012 | Murata et al. ............. 257/369 |
| 2012/0217544 A1* | 8/2012 | Ohki ....................... 257/194 |

FOREIGN PATENT DOCUMENTS

JP 2008-305894 A 12/2008

* cited by examiner

*Primary Examiner* — Phuc Dang
(74) *Attorney, Agent, or Firm* — Westerman, Hattori, Daniels & Adrian, LLP (57) ABSTRACT

A semiconductor device includes a gate electrode formed on a nitride semiconductor layer, and a source electrode and a drain electrode provided on the nitride semiconductor layer so as to interpose the gate electrode therebetween, a first silicon nitride film that covers the gate electrode and the silicon nitride film and has a composition ratio of silicon to nitrogen equal to or larger than 0.75, the first silicon nitride film having compressive stress solely, and a second silicon nitride film that is formed on the first silicon nitride film and has a composition ratio of silicon to nitrogen equal to or larger than 0.75 solely, a whole stacked layer structure of the first and second silicon nitride films having tensile stress.

11 Claims, 6 Drawing Sheets

| Sample | Si/N | Stress | Gate leakage | Collapse rate | Rate of variation in saturation current | Diffusion of Ni |
|---|---|---|---|---|---|---|
| A | 0.9 | −500 MPa | small | −60% | −10% | ○ |
| B | 0.7 | −500 MPa | small | −62% | −33% | ○ |
| C | 0.9 | +100 MPa | large | −5% | −5% | × |
| D | 0.7 | +100 MPa | large | −3% | −57% | × |

SEMICONDUCTOR DEVICE

CROSS REFERENCE TO RELATED APPLICATION

This application is based upon and claims the benefit of priority of the prior Japanese Patent Application No. 2012-087764, flied on Apr. 6, 2012, the entire contents of which are incorporated herein by reference

BACKGROUND (i) Technical Field

The present invention relates to semiconductor devices, and more particularly, to a semiconductor device having a silicon nitride film composed of two layers on a gate electrode.

(ii) Related Art

Semiconductor devices using nitride semiconductors are used in, for example, power devices capable of operating at high frequencies and outputting high power. Particularly, FETs (Field Effect Transistors) such as HEMT (High Electron Mobility Transistor) are known as transistors suitable for amplifying in high-frequency or RE bands, which may include microwaves, quasi-millimeter waves, or millimeter waves. Japanese Patent Application. Publication No. 2008-305894 discloses such FETs.

It is known that the current collapse phenomenon takes place in the semiconductor devices using the nitride semiconductors. It is required that the characteristics are not changed by or in test. It is also required that a metal included in the gate electrode does not diffuse into an insulating film.

SUMMARY

According to an aspect of the present invention, there is provided a semiconductor device includes a gate electrode formed on a nitride semiconductor layer, and a source electrode and a drain electrode provided on the nitride semiconductor layer so as to interpose the gate electrode therebetween, a first silicon nitride film that covers the gate electrode and the silicon nitride film and has a composition ratio of silicon to nitrogen equal to or larger than 0.75, the first silicon nitride film having compressive stress solely, and a second silicon nitride film that is formed on the first silicon nitride film and has a composition ratio of silicon to nitrogen equal to or larger than 0.75 solely, a whole stacked layer structure of the first and second silicon nitride films having tensile stress.

DETAILED DESCRIPTION

Figure 1:
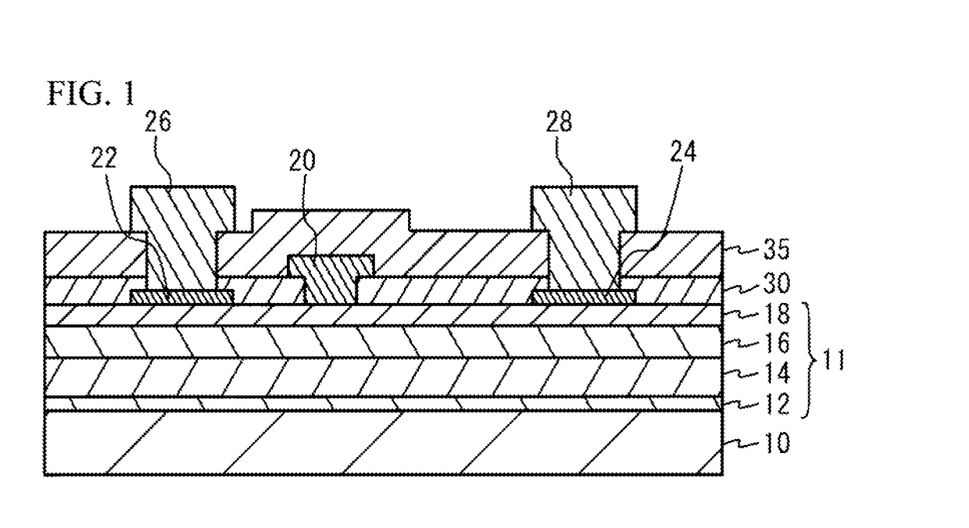
FIG. 1 is a cross-sectional view of a semiconductor device according to a first comparative example.

First, a description is given of an experiment conducted by the inventors in which FETs including nitride semiconductors are used. FIG. 1 is a cross-sectional view of a semiconductor device in accordance with a first comparative example. Referring to FIG. 1, a nitride semiconductor layer 11 is formed on a substrate 10, which is a SiC substrate by MOCVD (Metal Organic Chemical Vapor Deposition). For example, the substrate. 10 has (0001) main surface, and the nitride semiconductor layer 11 is stacked in the [0001] direction. The nitride semiconductor layer 11 includes a barrier layer 12, a channel layer 14, an electron supply layer 16, and a cap layer 13, which are stacked in this order from the substrate 10. The barrier layer 12 is an AlN (aluminum nitride) layer having a thickness of 300 nm. The channel layer 14 is a non-doped GaN (gallium nitride) layer having a thickness of 1000 nm. The electron supply layer 16 is an n-type AlGaN (aluminum gallium nitride) layer haying a thickness of 30 nm. The cap layer 18 is an n-type gallium nitride having a thickness of 5 nm.

On the nitride semiconductor layer 11, there is formed a gate electrode 20 having a nickel film and a golf (Au) film arranged in this order from the nitride semiconductor layer 11. A source electrode 22 and a drain electrode 24 are formed on the nitride semiconductor layer 11 so that the gate electrode 20 is interposed therebetween. Each of the source electrode 22 and the drain electrodes 24 includes a Ti (titanium) film and an Al (aluminum) film arranged in this order from the nitride semiconductor layer 11. An insulating film 30 that protects the nitride semiconductor layer 11 is formed thereon between the gate electrode 20 and the source electrode 22 and between the gate electrode 20 and the drain electrode 24. The insulating film 30 is a silicon nitride film having a thickness of 100 nm, which is grown by plasma CVD (Chemical Vapor Deposition). A silicon nitride film 35 is formed by plasma CVD so as to cover the gate electrode 20, the source electrode 22, the drain electrode 24 and the insulating film 30. A source line 26 and a drain line 28, which include Au, are formed so as to pierce the silicon nitride film 35 and the insulating film 30 and to be connected to the source electrode 22 and the drain electrode 24, respectively.

Figure 2:
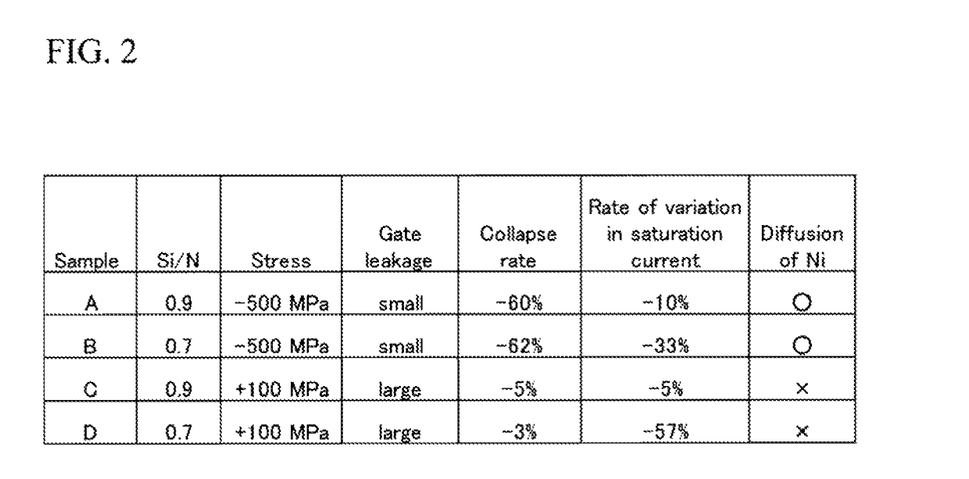
FIG. 2 illustrates characteristics of silicon nitride films and FETs of samples A through D.
Figure 3A:
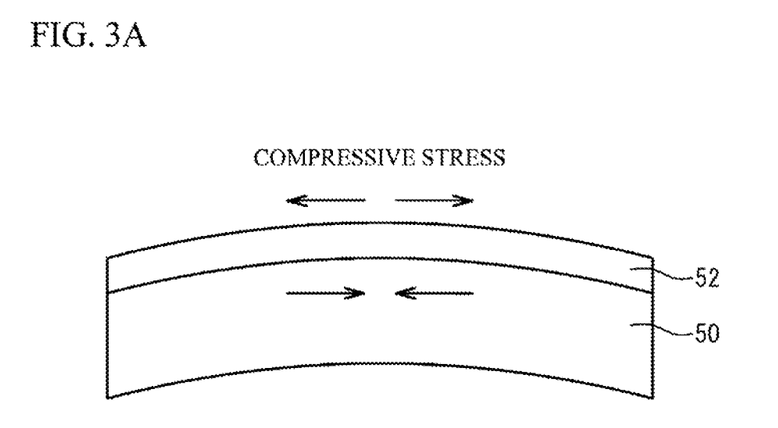
FIGS. 3A and 3B illustrate stress applied to a silicon nitride film.
Figure 3B:
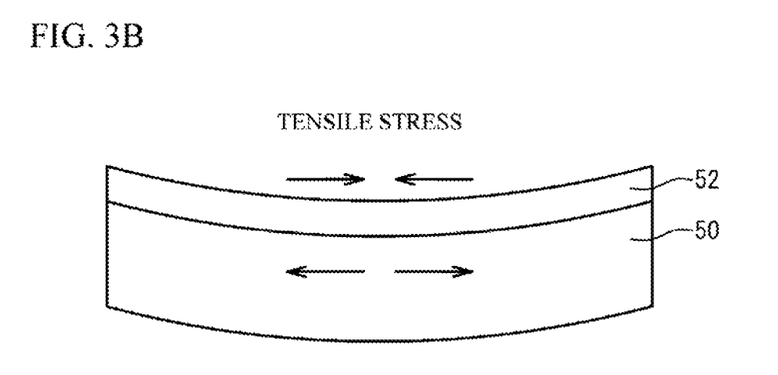

Four types of films are formed as the silicon nitride film 35. Samples of grown silicon nitride films are respectively assigned A through D. FIG. 2 illustrates characteristics of the silicon nitride films and FETs of samples A through D. FIGS. 3A and 3B are diagrams that illustrate stress on the silicon nitride film. As illustrated in FIG. 3A, compressive stress is defined as stress that compresses a substrate 50 due to expansion of a silicon nitride film 52 and is expressed by a negative value. As illustrated in FIG. 3B, tensile stress is defined as stress that strains the substrate 50 due to contraction of the silicon nitride film 52 and is expressed by a positive value.

As illustrated in FIG. 2, the silicon nitride films 35 of samples A through D have composition ratios (Si/N) of silicon to nitrogen of 0.9, 0.7, 0.9 and 0.7, respectively, and have stresses of −500 MPa, −500 MPa, +100 MPa and +100 MPa, respectively. The samples A through D are investigated in terms of gate leakage, collapse rate, rate of variation in saturation current, and diffusion of Ni.

The gate leakage is defined as leakage current that flows when a voltage that is negative to the gate electrode 20 is applied to the source electrode 22. The collapse phenomenon is a phenomenon in which the drain current decreases as the drain voltage increases. The collapse rate is expresses as ΔIfmax=(Ifmax (Vds=5V)−IfMax(Vds=20V))/Ifmax (Vds=5V) where Ifmax(Vds=5V) and Ifmax(Vds=20V) mean drain saturation currents obtained when the drain voltage Vds is 5 V and 20 V, respectively. For example, a collapse rate of −60% as in the case of sample A means that Ifmax for Vds of 20 V is 60% smaller than that for Vds of 5 V. As described above, it is preferable that the collapse rate is close to zero.

The rate of variation in saturation current indicates the rate of variation in ΔIfmax before and after the burn-in test. That is, ΔIfmax=Ifmax(Vds=5V)−IfMax(Vds=20V). The burn-in test is carried out for 1000 hours under the condition that the drain voltage Vds is 60 V, and the drain current Ids per unit gate width is 10 mA/mm.

Figure 4:
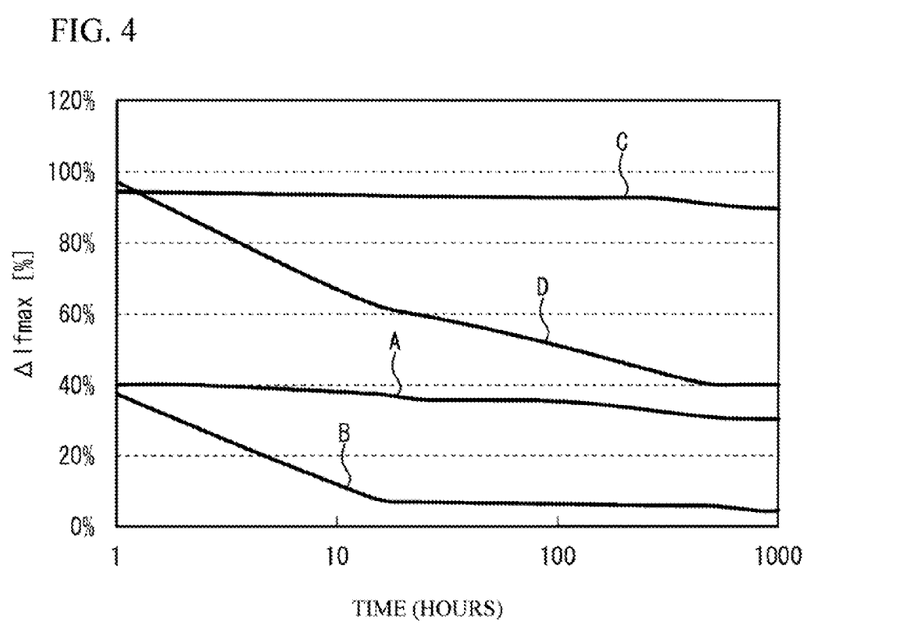
FIG. 4 illustrates results of a burn-in test for samples A through D.

The rate of variation in saturation current is preferably as small as possible. FIG. 4 illustrates results of the burn-in test for samples. A through D in which ΔIfmax is illustrated in association with time. Referring, to FIG. 4, at the commencement of the burn-in test, the drain saturation currents ΔIfmax of samples A and B axe smaller than those of samples C and D due to the occurrence of the collapse phenomenon. As the burn-in test goes on, the drain saturation currents ΔIfMax of samples B and D decrease. This is because the saturation currents decrease in samples B and D.

The diffusion of Ni indicates whether Ni contained in the gate electrode 20 diffuses into the silicon nitride film 35 in the burn-in test or not. In FIG. 2, O shows that diffusion of Ni does not occur, and X shows that diffusion of Ni occurs at high temperatures. More specifically, it is determined, after the burn-in test, whether Ni or Ni oxide included in the gate electrode 20 diffuses into the silicon nitride film 35. The cross section of FET in FIG. 1 is exposed by an FIB (Focused Ion Beam) apparatus, and is then observed by SEM (Scanning Electron Microscope). SEM views are not illustrated here. The Ni oxide is generated in such a manner that Ni included in the gate electrode 20 is oxidized by moisture absorbed to the silicon nitride film 35. The diffusion of Ni is more likely to occur in a case where a metal layer at a fixed potential such as a field plate or shield elect rode is formed on the silicon nitride film 35 on the gate electrode 20.

As illustrated in FIG. 2, samples A and B have a small gate leakage and a large negative collapse rate. In contrast, samples C and D have a large gate leakage and a collapse rate close to zero. The reason for the above is considered as follows. In samples A and B, compressive stress is applied to the nitride semiconductor layer 11 by the silicon nitride film 35. This results in negative polarization in the vicinity of the channel layer 14 of the nitride semiconductor layer 11 due to piezoelectric polarization. The negative polarization increases the potential in the vicinity of the channel layer 14. Thus, the saturation current Ifmax before the burn-in test is decreased and the gate leakage is reduced. The reduced gate leakage increases the collapse phenomenon although its mechanism is unclear.

The rate of variation in the saturation current is small in samples A and C, and is large in samples B and D. The reason for the above is considered as follows. The silicon nitride films 35 of samples A and C are silicon rich films as compared with a stoichiometric Si/N of 0.75. Excessive silicon atoms form many trap levels in the silicon nitride film 35. An electric field applied to a silicon-rich silicon nitride film results in hopping conduction via the trap levels. Therefore, the silicon rich film has a large leakage current that flows in the silicon nitride film, as compared with the stoichiometric silicon nitride film. The use of the film having a large leakage current reduces characteristic changes such as variation in the saturation current in the burn-in test, although the detailed mechanism thereof is unclear.

The diffusion of Ni in samples A and B is small and is large in samples C and D. This is because the silicon nitride film to which compressive stress is applied is a dense film and suppresses diffusion of Ni or Ni oxide.

As described above, samples C and D are preferable for reduction of the collapse phenomenon. Samples A and C are preferable in order to reduce the rate of variation in the saturation current in the burning test. Diffusion of Ni is preferably suppressed in samples A and B. As described above, conventionally, there is no available condition of the silicon nitride film capable of satisfying all of the suppression of the collapse phenomenon, suppression of the characteristic changes by the burn-in test, and suppression of diffusion of Ni.

Now, exemplary semiconductor devices that satisfy all of the above items are described.

First Embodiment

Figure 5:
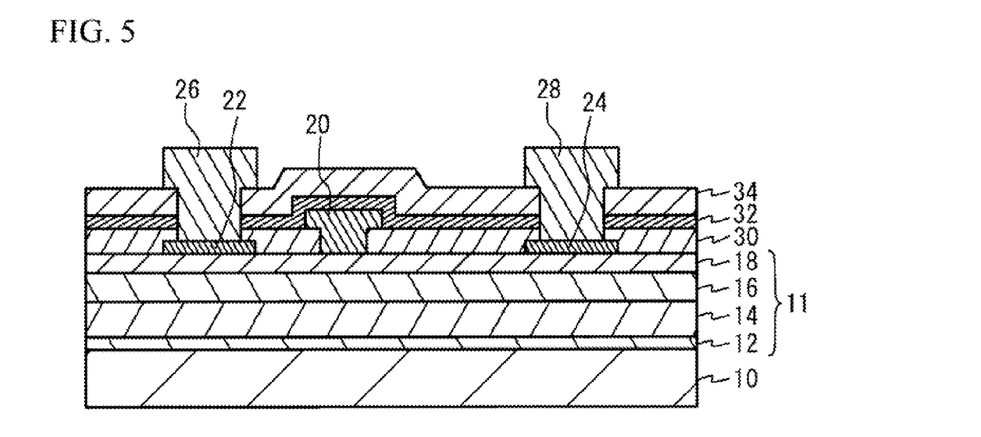
FIG. 5 is a cross-sectional view of a semiconductor device in accordance with a first embodiment.

FIG. 5 is a cross-sectional view of a semiconductor device in accordance with a first embodiment. As illustrated in FIG. 5, a first silicon nitride film 32 is formed so as to cover the gate electrode 20 instead of the silicon nitride film 35 illustrated in FIG. 1. A second silicon nitride film 34 is formed on the first silicon nitride film 32. The first silicon nitride film 32 has a composition ratio of silicon to nitrogen Si/N that is larger than 0.75, and has compressive stress. The second silicon nitride film 34 has a Si/N ratio larger than 0.75 and has tensile stress. The structures other than the above are the same as those in FIG. 1, and a description thereof is omitted here.

An arrangement such that at least one of the first nitrogen silicon film 32 and the second nitride silicon film 34 is a dense film having compressive stress is effective in suppression of diffusion of Ni. More particularly, diffusion of Ni is effectively suppressed in a case where the first silicon nitride film 32 closer to the gate electrode 20 is a dense film having compressive stress. For example, it is effective to cover the gate electrode 20 (side and upper surfaces) with the first silicon nitride film 32 having compressive stress.

In order to suppress the collapse phenomenon, it is preferable that the total stress of the first silicon nitride film 32 and the second silicon nitride film 34 a weak compressive or tensile stress. In a case where the first silicon nitride film 32 is selected so as to have strong compressive stress for the purpose of suppression of diffusion of Ni, it is effective to arrange the second silicon nitride film 34 to have tensile stress. Therefore, a grain density, which is a density of a bond between silicon atom and nitrogen atom, of the first silicon nitride film 32 is denser than that of the second silicon nitride film 34. This arrangement makes it possible to relax compressive stress resulting from the first silicon nitride film Thus, it is possible to suppress the gate leakage due to the piezoelectric charge and suppress the collapse phenomenon.

In order to suppress characteristic changes in the burn-in test, it is preferable that leakage current flows in both the first silicon nitride film 32 and the second silicon nitride film 34. The leakage current that flows in either one of they first silicon nitride film 32 and the second silicon nitride film 34 is insufficient to suppress characteristic changes. Thus, it is preferable that the first silicon nitride film 32 and the second silicon nitride film 34 satisfy Si/N>0.75. Thus, sufficient leakage current flows in the silicon nitride films with the electric field being applied, so that the characteristic changes in the characteristics in the burn-in test can be suppressed.

It can be seen from the above that the first silicon nitride film 32 is a silicon nitride film that satisfies Si/N>07.5 and has compressive stress solely (for example, sample A in FIG. 2. The second silicon nitride film 34 is a silicon nitride film that satisfies Si/N>0.75 and has tensile stress solely (for example, sample C in FIG. 2). Thus, it is possible to suppress the collapse phenomenon, the characteristic changes in the burn-in test and the diffusion of Ni.

The ratios Si/N of the first silicon nitride film 32 and the second silicon nitride film 34 are preferably equal to or larger than 0.8, and is more preferably equal to or larger than 0.85 or 0.9 in order to obtain the effects of the silicon rich films. Since the silicon nitride films do not change to an amorphous silicon structure, the ratio Si/N is preferably equal to or smaller than 1.1. The stress of the first silicon nitride film 32 is preferably equal or lower than −300 MPa, more preferably equal to or lower than −400 MPa, and is much more preferably equal to or lower than −500 MPa. In terms of prevention of film removal, it is preferable that the stress applied no the first silicon nitride film 32 is equal to or larger than −1 GPa. Thus, the first silicon nitride film 32 preferably has compressive stress of 300 Mpa or more of 1 Gpa or less under a room temperature to the substrate 10. In terms of relaxation of compressive stress applied to the first silicon nitride film 32, it is preferable that the stress applied to the second silicon nitride film 34 is equal to or larger than 50 MPa and is more particularly equal to or larger than 100 MPa or 200 MPa. In terms of suppression of film removal, the stress applied to the second silicon nitride film 34 is preferably equal to or smaller than 1 GPa. Thus, the second silicon nitride film 34 preferably has tensile stress of 50 Mpa or more of 1 Gpa or less under a room temperature to the substrate 10. For the purpose of suppress of the collapse phenomenon, it is preferable that the whole stacked structure of the first silicon nitride film 32 and the second silicon nitride film 34 has tensile stress.

The gate electrode 20 of the above example has an exemplary structure that includes the Ni film and the Au film. It is preferable that the gate electrode 20 includes a portion containing Ni and this portion is covered with the first silicon nitride film 32. In a case where the gate electrode 20 does not include Ni but includes another element that is likely to diffuse into another layer, such as Ti, the first silicon nitride film 32 prevents diffusion of such element. The first silicon nitride film 32 is dense and is effective in moisture proof.

In the first embodiment, the insulating film 30 is interposed between the nitride semiconductor layer 11 and the first silicon nitride film 32. However, the insulating film 30 may be omitted. For example, the first silicon nitride film 32 may be formed directly on the nitride semiconductor layer 11. However, it is preferable to provide the insulating film 30 in order to suppress any damage caused to the nitride semiconductor layer 11 at the time of forming the first silicon nitride film 32.

Figure 6A:
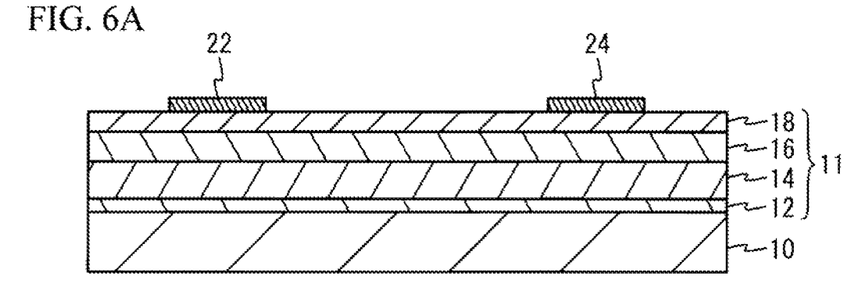
FIGS. 6A through 6C are cross-sectional views illustrating steps of a method for fabricating the semiconductor device in accordance with the first embodiment.

Now, a description will be given of a method of manufacturing the semiconductor device in accordance with the first embodiment. FIGS. 6A through 6C and FIGS. 7A through 7C are respectively cross-sectional views that illustrate the manufacturing method of the first embodiment. As illustrated in FIG. 6A, the nitride semiconductor layer 11 is formed on the substrate 10, which may be a SiC substrate. The nitride semiconductor layer 11 may include the barrier layer 12, the channel layer 14, the electron supply layer 16 and the cap layer 18 stacked in this order from the substrate 10 by MOCVD. The source electrode 22 and the drain electrode 24, are formed on the nitride semiconductor layer 11 by the evaporation method and liftoff method, for example. The source electrode 22 and the drain electrode 24 may include a Ti film and an Al film stacked in this order from the nitride semiconductor layer 11.

Figure 6B:
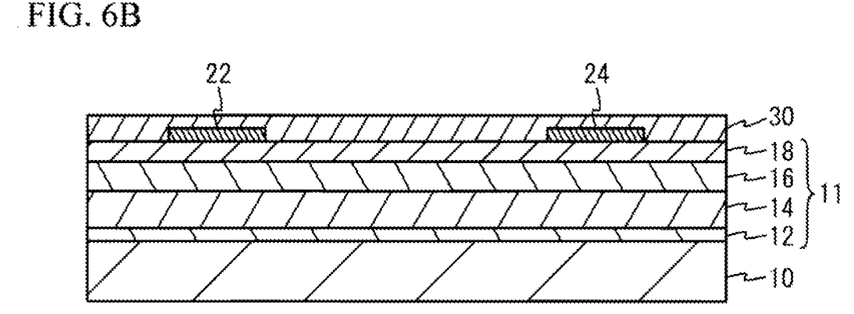

As illustrated in FIG. 6B, the nitride semiconductor layer 11 is formed on the insulating film 30 so as to cover the source electrode 22 and the drain electrode 24. The insulating film 30 may be a silicon nitride film by plasma CVD. The insulating film 30 may be an insulating film other than the silicon nitride film such as a silicon oxide film.

Figure 6C:
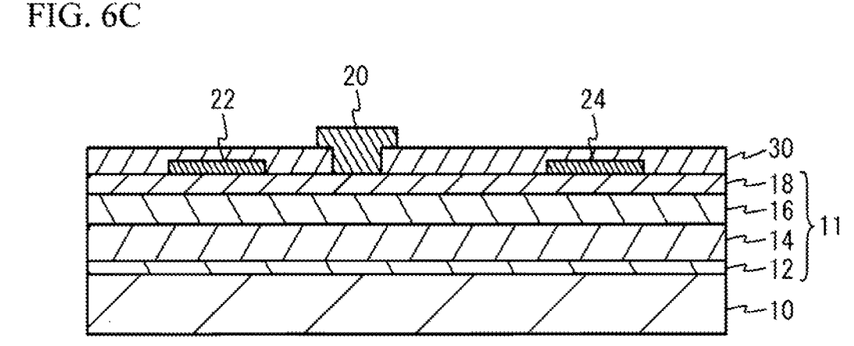

As illustrated in FIG. 6C, an opening is formed in a given area of the insulating film 30. The gate electrode 20 is formed in the nitride semiconductor layer 11 in the opening by, for example, the evaporation method and the liftoff method. The gate electrode 20 may include the Ni film and the Au film stacked in this order from the nitride semiconductor layer 11. As described above, the gate electrode 20, the source electrode 22 and the drain electrode 24 are formed on the nitride semiconductor layer 11 so that the gate electrode 20 is interposed between the source electrode 22 and the drain electrode 24.

Figure 7A:
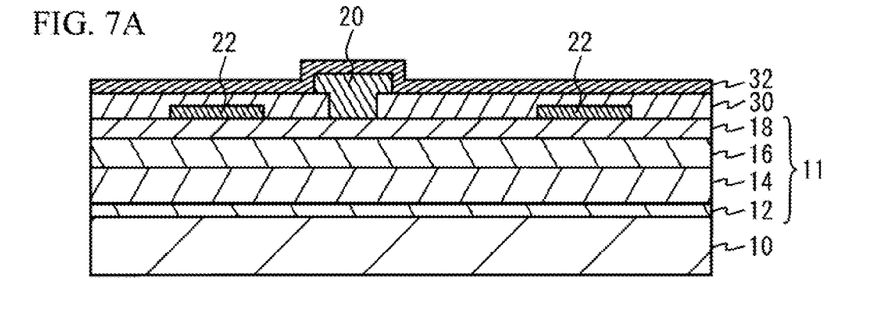
FIGS. 7A through 7C are cross-sectional views illustrating steps that follow the steps illustrated in FIGS. 6A through 6C.

As illustrated in FIG. 7A, the first silicon nitride film 32 is formed on the insulating film 30 so at to cover the gate electrode 20, the source electrode 22 and the drain electrode 24. The following are exemplary conditions for growing the first silicon nitride film 32 and an exemplary range of conditions:

[Exemplary Conditions]
  Method of growing film: plasma CVD
  Gas: $SiH_4$, $N_2$, He
  Gas flow rate: $SiH_4$: 50 sccm, $N_2$: 300 sccm, He: 800 sccm
  Pressure: 0.5 Torr
  RF (Radio Frequency) power: 250 W
  Temperature: 300° C.
  Film thickness: 50 nm
[Exemplary Range of Conditions]
  Gas flow rate: $SiH_4$: 3-60 sccm, $N_2$: 100-500 sccm, He: 500-1000 sccm
  Pressure: 0.2-2.0 Torr
  RF power: 30-300 W
  Temperature: 200-300° C.
  Film thickness: 10-100 nm The silicon nitride film having a desired Si/N ratio may be realized by controlling the ratio of the flow rates of the silicon source gas (for example, $SiH_4$) and the nitrogen source gas (for example, $N_2$). Compressive stress is realized by increasing the flow rate of He to the total gas flow rate, and tensile stress is realized by decreasing the flow rate of He.

Figure 7B:
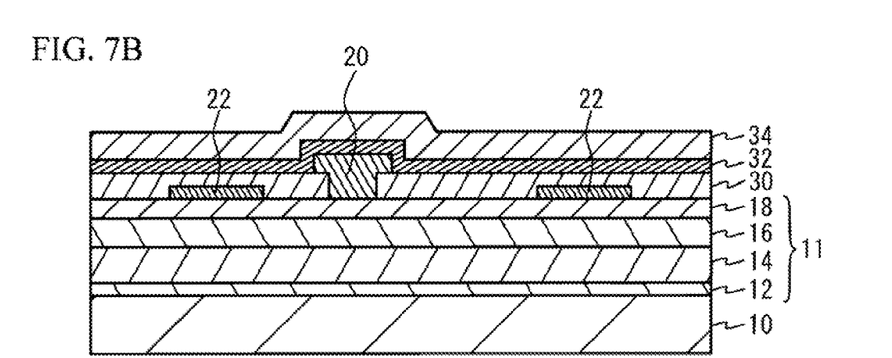

As illustrated in FIG. 7B, the second silicon nitride film 34 is formed on the first silicon nitride film 32. The second silicon nitride film 34 is formed no as to have a shape corresponding to steps of the first silicon nitride film 32. The following are exemplary conditions for growing the second silicon nitride film 34 and an exemplary range of conditions:

Method of growing film: plasma CVD
  Gas: $SiH_4$, $NH_3$, $N_2$, He
  Gas flow rate: $SiH_4$: 5 sccm, $NH_3$: 1 sccm, $N_2$: 600 sccm, He: 500 sccm
  Pressure: 0.9 Torr
  RF (Radio Frequency) power: 50 W
  Temperature: 300° C.
  Film thickness: 350 nm
[Exemplary Range of Conditions]
  Gas flow rate: $SiH_4$: 3-60 sccm, $NH_3$: 0.5-5 sccm, $N_2$: 100-2000 sccm, He: 0-600 sccm
  Pressure: 0.2-1.8 Torr
  RF power: 30-300 W
  Temperature: 200-300° C.

Film thickness: 200-600 nm

By additionally using NH$_3$ as the nitrogen source gas, the stress applied to the silicon nitride film is changed towards the tensile stress side. For example, the addition of NH$_3$ realizes the fine adjustment of the stress applied to the second silicon nitride film 34.

For example, the flow rate of He to the total flow rate of the as for growing the first silicon nitride film 32 is made larger than the flow rate of He to the total flow rate of the gas for growing the second silicon nitride film 34 when the first silicon nitride film 32 and the second silicon nitride film 34 are grown by plasma. This setting realizes the first silicon nitride film 32 having compressive stress and the second silicon nitride film 34 having tensile stress.

Figure 7C:
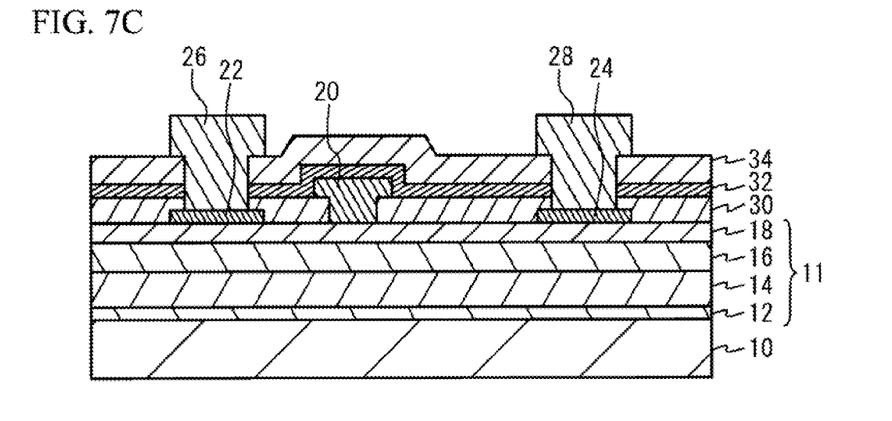

As illustrated in FIG. 7C, openings are formed in the first silicon nitride film 32 and the second silicon nitride film 34. The source line 26 and the drain line 28, which are electrically connected to the source electrode 22 and the drain electrode 24 in the openings, respectively, may be formed by Au plating. Thus, the semiconductor device illustrated in FIG. 5 is available.

Second Embodiment

Figure 8:
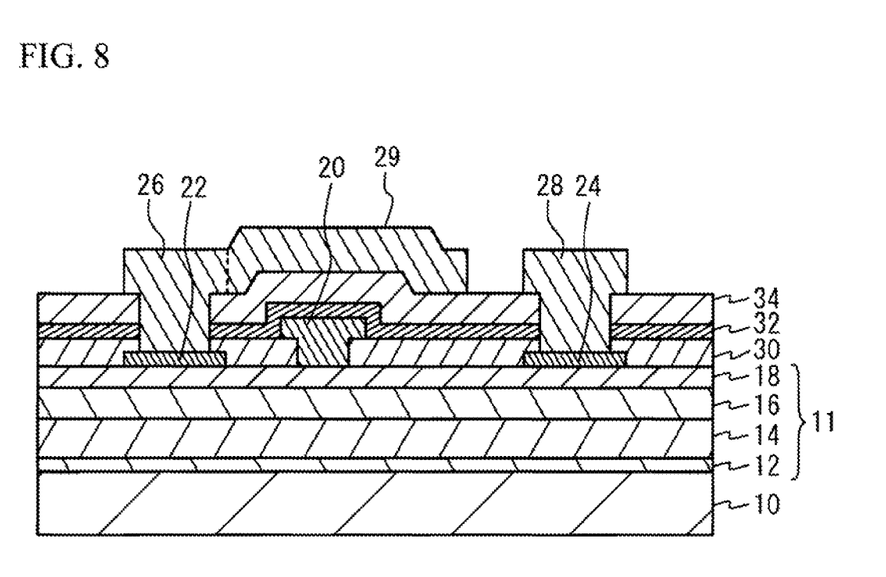
FIG. 8 is a cross-sectional view of a semiconductor device in accordance with a second embodiment.

FIG. 8 is a cross-sectional view of a semiconductor device in accordance with a second embodiment. Referring to FIG. 8, a shield electrode (source wall) 29 connected to the source line 26 is formed on the second silicon nitride film 34 so as to cover the gate electrode 20. The shield electrode 29 may be a field plate, which is a metal layer at a potential equal to that of the source electrode provided between the gate electrode and the drain electrode on the second silicon nitride film. Foe instance, the shield electrode 29 (a metal layer) is located between the gate electrode 20 and the drain electrode 24, and is provided on the second silicon nitride film 34. The other structures of the second embodiment are the same as those of the first embodiment illustrated in FIG. 5, and a description thereof is omitted.

According to the second embodiment, the metal layer of the shield electrode 29 is formed on the second silicon nitride film 34. If a metal layer such as the shield electrode 29 is formed on the silicon nitride film, a metal contained in the gate electrode 20 such as Ni diffuses therefrom and reach the metal layer in the burn-in test. Therefore, the gate electrode 20 and the metal layer may be short-circuited. In this case, it is preferable that the first silicon nitride film 32 having compressive stress is provided in the vicinity of the gate electrode 20.

In the first and second embodiments, the nitride semiconductor layer 11 may have at least one of, for example, GaN, InN, AlGaN, InGaN, AlInN and AlInGaN.

The present invention is not limited to the specifically described embodiments, but may include other embodiments and variations without departing from the scope of the present invention.

What is claimed is:

1. A semiconductor device comprising:
    a gate electrode formed on a nitride semiconductor layer, and a source electrode and a drain electrode provided on the nitride semiconductor layer so that the gate electrode is interposed between the source electrode and the drain electrode;
    a first silicon nitride film that covers the gate electrode and is formed on or above the nitride semiconductor layer between the gate electrode and the source electrode and between the gate electrode and the drain electrode; and
    a second silicon nitride film that is formed on the first silicon nitride film,
    wherein a whole stacked layer structure of the first and second silicon nitride films has a tensile stress to the substrate, and a grain density of the first silicon nitride film is denser than that of the second silicon nitride film,
    wherein the first silicon nitride film has compressive stress of 300 Mpa or more of 1 Gpa or less under a room temperature to the substrate, and
    wherein the second silicon nitride film has tensile stress of 50 Mpa or more of 1 Gpa or less under a room temperature to the substrate.

2. A semiconductor device according to claim 1,
    wherein the first and second silicon nitride films have a composition ratio of silicon to nitrogen larger than 0.75.

3. The semiconductor device according to claim 1, wherein the first and second silicon nitride films have a composition ratio of silicon to nitrogen equal to or larger than 0.8.

4. The semiconductor device according to claim 1, wherein the first and second silicon nitride films have a composition ratio of silicon to nitrogen equal to or larger than 0.85.

5. The semiconductor device according to claim 1, wherein the first and second silicon nitride films have a composition ratio of silicon to nitrogen equal to or larger than 0.90.

6. The semiconductor device according to claim 1, wherein the gate electrode includes a film that includes nickel and directly contacts the first silicon nitride film.

7. The semiconductor device according to claim 6, wherein the gate electrode includes another film that includes gold and is provided on the film including nickel.

8. The semiconductor device according to claim 1, further comprising a metal layer located between the gate electrode and the drain electrode, the metal layer being provided on the second silicon nitride film.

9. The semiconductor device according to claim 1,
    wherein the first and second silicon nitride films are grown by a plasma deposition method, and a flow rate of He to a total flow rate of a gas for growing the first silicon nitride film is larger than a flow rate of He to a total flow rate of a gas for growing the second silicon nitride film.

10. The semiconductor device according to claim 1,
    wherein the grain density of the first silicon nitride film is density of a bond between a silicon atom and a nitrogen atom.

11. The semiconductor device according to claim 1, further comprising:
    an insulating film that is formed directly on the nitride semiconductor layer between the gate electrode and the source electrode and between the gate electrode and the drain electrode,
    wherein the first silicon nitride film is formed directly on the insulating film.

* * * * *